United States Patent [19]

Kuroyanagi et al.

[11] Patent Number: 5,550,067
[45] Date of Patent: Aug. 27, 1996

[54] METHOD FOR PRODUCING SEMICONDUCTOR DEVICE HAVING DMOS AND NMOS ELEMENTS FORMED IN THE SAME SUBSTRATE

[75] Inventors: Akira Kuroyanagi; Yutaka Tomatsu, both of Okazaki; Yasuaki Tsuzuki, Anjo, all of Japan

[73] Assignee: Nippondenso Co., Ltd., Kariya, Japan

[21] Appl. No.: 38,953

[22] Filed: Mar. 29, 1993

[30] Foreign Application Priority Data

Mar. 30, 1992 [JP] Japan ................................. 4-074554

[51] Int. Cl.⁶ .................................................. H01L 21/265
[52] U.S. Cl. ............................................................. 437/41
[58] Field of Search ............................. 437/27–30, 154, 437/41, 40, 44, 29, 41, 40 DM, 41 DM, 61 DM; 257/335–338, 339, 340, 341, 342

[56] References Cited

U.S. PATENT DOCUMENTS

| | | | |
|---|---|---|---|
| 4,783,690 | 11/1988 | Walden et al. | 357/23.4 |
| 4,837,606 | 6/1989 | Goodman et al. | 257/341 |
| 4,881,112 | 11/1989 | Matsushita | 257/338 |
| 4,896,199 | 1/1990 | Tsuzuki et al. | 357/28 |
| 4,987,098 | 1/1991 | Nishiura et al. | 437/142 |
| 5,023,191 | 6/1991 | Sakurai | 437/27 |
| 5,045,900 | 9/1991 | Tamagawa | 257/338 |
| 5,164,327 | 11/1992 | Maruyama | 437/40 |
| 5,200,638 | 4/1993 | Kida et al. | 257/368 |
| 5,242,841 | 9/1993 | Smayling et al. | 437/29 |
| 5,250,449 | 10/1993 | Kuroyanagi et al. | 437/40 |
| 5,272,098 | 12/1993 | Smayling et al. | 437/41 |
| 5,397,905 | 3/1995 | Otsuki et al. | 257/335 |

FOREIGN PATENT DOCUMENTS

| | | |
|---|---|---|
| 58-197771 | 11/1983 | Japan . |
| 62-213272 | 9/1987 | Japan . |
| 62-229866 | 10/1987 | Japan . |
| 1276673 | 11/1989 | Japan . |
| 4142040 | 5/1992 | Japan . |

OTHER PUBLICATIONS

Wolf, S. and R. Tauber "Silicon Processing for the VLSI Era", vol. 1 Lattice Press, Sunset Beach, CA 1986.

*Primary Examiner*—George Fourson
*Assistant Examiner*—Brian K. Dutton
*Attorney, Agent, or Firm*—Cushman, Darby & Cushman

[57] ABSTRACT

An intelligent power element has integrated DMOS transistors and control elements such as NMOS transistors. Impurity concentration inside a channel well (4) of each DMOS transistor is denser than that at the surface thereof. This results in reducing the reach-through withstand voltage of the DMOS transistor to less than that of the NMOS transistor. As a result, a reach-through phenomenon occurs on the DMOS transistor having a higher allowable (withstand) current before it occurs on the NMOS transistor having a lower allowable current. To provide the same effect, the reach-through withstand voltage of the DMOS transistor may be decreased by forming an internal high concentration well (201) at an upper part of a deep main well (31) of the DMOS transistor. The well (201) is shallower than the main well (31) and does not extend under a gate electrode (71).

21 Claims, 10 Drawing Sheets

METHOD FOR PRODUCING SEMICONDUCTOR DEVICE HAVING DMOS AND NMOS ELEMENTS FORMED IN THE SAME SUBSTRATE

BACKGROUND OF THE INVENTION

1. Field of the Invention

The present invention relates to a power semiconductor device and a method for producing the same.

2. Description of the Related Art

U.S. Pat. No. 4,783,690 discloses a power semiconductor element having integrated vertical type double diffused insulated-gate transistors (DMOS transistors). To fabricate the integrated DMOS transistors, this disclosure prepares a high concentration substrate of a first conductivity type, forms a low concentration layer of the first conductivity type over the substrate, and forms a deep well (a main well) of a second conductivity type as well as a channel well of the second conductivity type in the layer. The main well does not extend under a gate electrode. The channel well is shallower than the main well and reaches a channel under the gate electrode to determine the threshold voltage of the transistor. The disclosure then forms a high concentration source of the first conductivity type in the channel well.

There has been proposed a power semiconductor device (an intelligent power element) employing such DMOS transistors as well as NMOS transistors. A subwell of the second conductivity type is formed in a layer on which the DMOS transistor is formed, and a planar (lateral) NMOS transistor is formed in the subwell. The NMOS transistor serves as a control element for the DMOS transistor.

The subwell may be simply formed in the same process for forming a main well for the DMOS transistor. When the main well and subwell are formed in the same ion implantation process, they may have the same depth and the same concentration distribution. This provides the following problem.

To drive the intelligent power element with a low voltage supply, it is necessary to lower the threshold voltage Vt of the DMOS transistor. The low threshold voltage may be realized by a low impurity concentration in the channel well of the DMOS transistor. This increases the reach-through withstand voltage of the DMOS transistor, and narrows the difference between the reach-through withstand voltage of the DMOS transistor and that of the NMOS transistor. As a result, when the DMOS transistor causes a reach-through phenomenon, the same phenomenon also occurs at the NMOS transistor, so that the NMOS transistor, having a smaller allowable current, will break down earlier than the DMOS transistor.

This problem usually occurs when intermittently controlling a reactive load. This will be explained more precisely.

In the intelligent power element, a substrate, i.e., a drain is connected to a high-potential power source (for example, a positive power source) through the reactive load. When a gate is turned OFF, the reactive load applies a back electromotive voltage to the substrate. When the back electromotive voltage exceeds the reach-through withstand voltage of the DMOS or NMOS transistor, a reach-through phenomenon occurs.

Figure 20A:
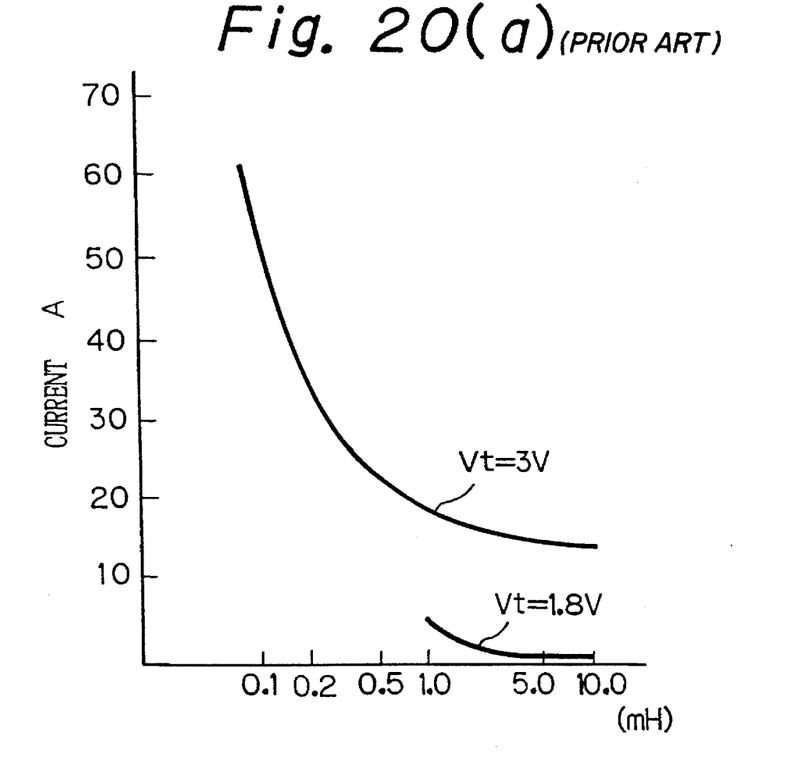
FIG. 20(a) is a diagram showing a relationship between the inductance of a reactive load and an allowable (withstand) current of a conventional DMOS-NMOS intelligent power element.
Figure 20B:
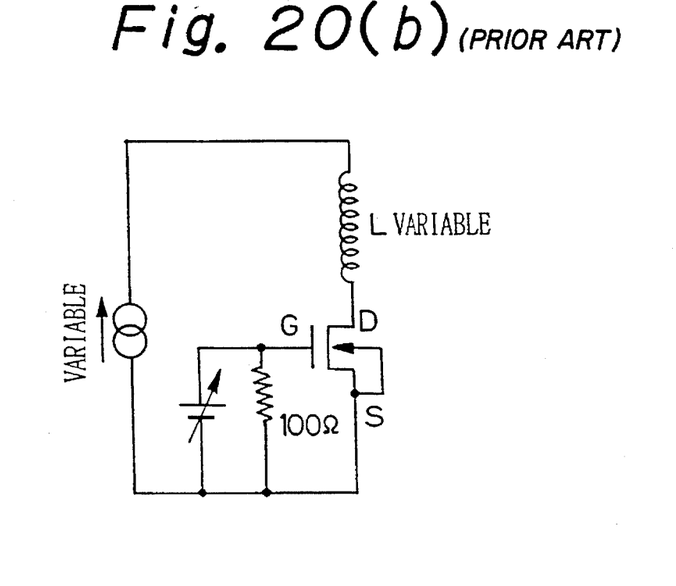
FIG. 20(b) shows an equivalent conventional test circuit used for preparing the diagram of FIG. 20(a)

FIG. 20(a) shows results of reactive load tests carried out with a test circuit of FIG. 20(b) on semiconductor devices having threshold voltages Vt of 3 V and 1.8 V. These different threshold voltages of the devices are materialized by controlling the impurity concentration in the channel wells of the devices.

In FIG. 20(a), the abscissa represents the inductance of the reactive load and the ordinate represents breakdown current. When L=1 mH, the device of Vt=3 V has an allowable current of 20 A, while the device of Vt=1.8 V has an allowable current of only about 4 A. When L=5 mH or over, the device of Vt=1.8 V substantially shows no allowable current.

These test results will be analyzed.

The reason why the allowable current of the device of Vt=1.8 V is low will be analyzed at first. Only the source of each lateral NMOS transistor was damaged in the tests. (Usually, the source of an NMOS transistor has a lower potential and a higher reach-through electric field than the drain thereof.) On the other hand, the device of Vt=3 V having a higher reach-through withstand voltage was damaged at its DMOS transistors.

Decreasing the threshold voltage Vt of the DMOS transistor from 3 V to 1.8 V is materialized by decreasing the impurity concentration of the channel well of the DMOS transistor. When the channel well is low in impurity concentration, a junction depletion layer in the main well of the DMOS transistor extends upwardly. This results in increasing the reach-through withstand voltage of the DMOS transistor.

In the device of Vt=1.8 V, the reach-through withstand voltage of the DMOS transistor is nearly equal to that of the NMOS transistor. Accordingly, when a breakdown occurs in the DMOS transistor, the same will always occur in the NMOS transistor. Namely, the source of the NMOS transistor, having a small allowable current, breaks down and reduces the allowable (withstand) current of the device.

On the other hand, in the device of Vt=3 V, the reach-through withstand voltage of the DMOS transistor is sufficiently lower than that of the NMOS transistor, so that the DMOS transistor, having a larger allowable current, first suffers a reach-through breakdown to absorb current due to the accumulated energy of the reactive load. Namely, the DMOS transistor having a large allowable (withstand) current provides the device with a large breakdown current.

Results of tests carried out on samples of Vt=3.2 V and Vt=1.8 V will be explained. These samples had an $n^+$ substrate of $10^{20}$ atoms/cc or over, an $n^-$ epitaxial layer of $5 \times 10^{15}$ atoms/cc formed on the substrate, and a $p^-$ main well and a subwell of $3 \times 10^{13}$ dose/cm$^2$ each. A $p^-$ channel well of the sample of Vt=3.2 V was of $1 \times 10^{14}$ dose/cm$^2$, and that of the sample of Vt=1.8 V was of $7 \times 10^{13}$ dose/cm$^2$.

In the sample of Vt=3.2 V, each DMOS transistor had a reach-through withstand voltage of 85 V and each NMOS transistor had a reach-through withstand voltage of 90 V, and had an allowable current of 16 to 18 A with respect to a reactive load of 5 mH. On the other hand, in the sample of Vt=1.8 V, each DMOS transistor had a 90 V withstand voltage and each NMOS transistor had a 91 V withstand voltage. Since the withstand voltages of the DMOS and NMOS transistors of the sample of Vt=1.8 V are nearly equal to each other, the NMOS breaks down successively and provides the sample with an allowable current of only 1 A or less.

SUMMARY OF THE INVENTION

An object of the present invention is to improve the reach-through withstand characteristics of an intelligent power element having a low threshold voltage, when driving a reactive load.

In order to accomplish the object, a semiconductor device according to a first aspect of the present invention basically has:

a high concentration semiconductor substrate of the first conduction type serving as a drain and having on the surface thereof a low concentration layer of the first conductivity type;

a deep main well of the second conductivity type formed in the layer in a vertical semiconductor device forming area;

a gate electrode formed over the layer, except in the main well area interposing on a gate insulation film therebetween;

a channel well of second conductivity type, overlapping the main well and being shallower than the main well, an edge of the channel well extending under the gate electrode;

a high concentration source of first conductivity type formed in the channel well such that the source is shallower and narrower than the channel well and extends under the gate electrode; and a subwell of second conductivity type formed by doping, with the same impurities as for the main well, a semiconductor island forming area in the layer.

Impurity concentration inside the channel well is denser than that at the surface thereof.

According to the present invention, the main well corresponds to the vertical semiconductor device forming area, and the subwell corresponds to the semiconductor island forming area.

A second aspect of the present invention provides a method for producing a semiconductor device, including the steps of:

preparing a high concentration semiconductor substrate of first conduction type, forming a low concentration layer of first conductivity type over the substrate, and implanting ions to form a deep main well of second conductivity type as well as a deep subwell of second conductivity type in the layer;

forming a gate electrode for the main well, interposing a gate insulation film formed on the layer, in a vertical semiconductor device forming area except the main well area;

forming a channel well of second conductivity type such that an edge of the channel well extends under the gate electrode and such that the channel well overlaps the main well and is shallower than the main well;

forming a high concentration internal well of the second conductivity type such that an edge of the internal well does not extend under the gate electrode and such that the internal well overlaps the main well and channel well and is shallower than the main well; and forming a high concentration source of the first conductivity type on the channel well such that an edge of the source extends under the gate electrode and such that the source is shallower and narrower than the channel well.

In the semiconductor device of the first aspect, impurity concentration in the channel well of each DMOS transistor is dense in the inside thereof and less dense at the surface thereof, even if the threshold voltage Vt of the DMOS transistor is low.

When a substrate voltage increases, a junction depletion layer between the main well and the layer in each DMOS transistor grows upwardly. At this time, the internal high concentration part of the channel well blocks the growth of the depletion layer. This results in increasing an electric field at the junction depletion layer, to keep the reach-through withstand voltage of the DMOS transistor low irrespective of a decrease in the threshold voltage Vt of the DMOS transistor.

Namely, the impurity distribution, which is dense in the inside and less dense at the surface, of the channel well of each DMOS transistor of the semiconductor device according to the first aspect of the present invention allows the threshold voltage Vt of the DMOS transistor to be reduced without increasing the reach-through voltage of the DMOS transistor. Accordingly, although the subwell for the NMOS transistor is formed in the same process as of the main well for the DMOS transistor, the reach-through withstand voltage of the control element (NMOS transistor) will be sufficiently higher than that of the DMOS transistor.

When a large substrate voltage is applied, the DMOS transistor having a larger allowable current a reach-through phenomenon earlier than the control element (NMOS transistor). Namely, the control element having a smaller allowable current will not be easily damaged due to the reach-through phenomenon.

The present invention thus provides an intelligent power element having excellent reach-through withstand characteristics. The profile of the channel well is realized by simply increasing the ion acceleration voltage. Accordingly, unlike the prior art, the present invention requires no complicated processes.

The method for producing a semiconductor device according to the second aspect of the present invention forms a high concentration internal well in a main well of each DMOS transistor such that the internal well is shallower than the main well and does not extend under a gate electrode. This increase the impurity concentration at the upper part of the main well without increasing the threshold voltage Vt of the DMOS transistor. This results in reducing the reach-through withstand voltage of the DMOS transistor, to prevent a reach-through phenomenon in a control element, an NMOS transistor having a smaller allowable current, and improve the reach-through characteristics of the device.

DESCRIPTION OF THE PREFERRED EMBODIMENTS (First embodiment)

Figure 1:
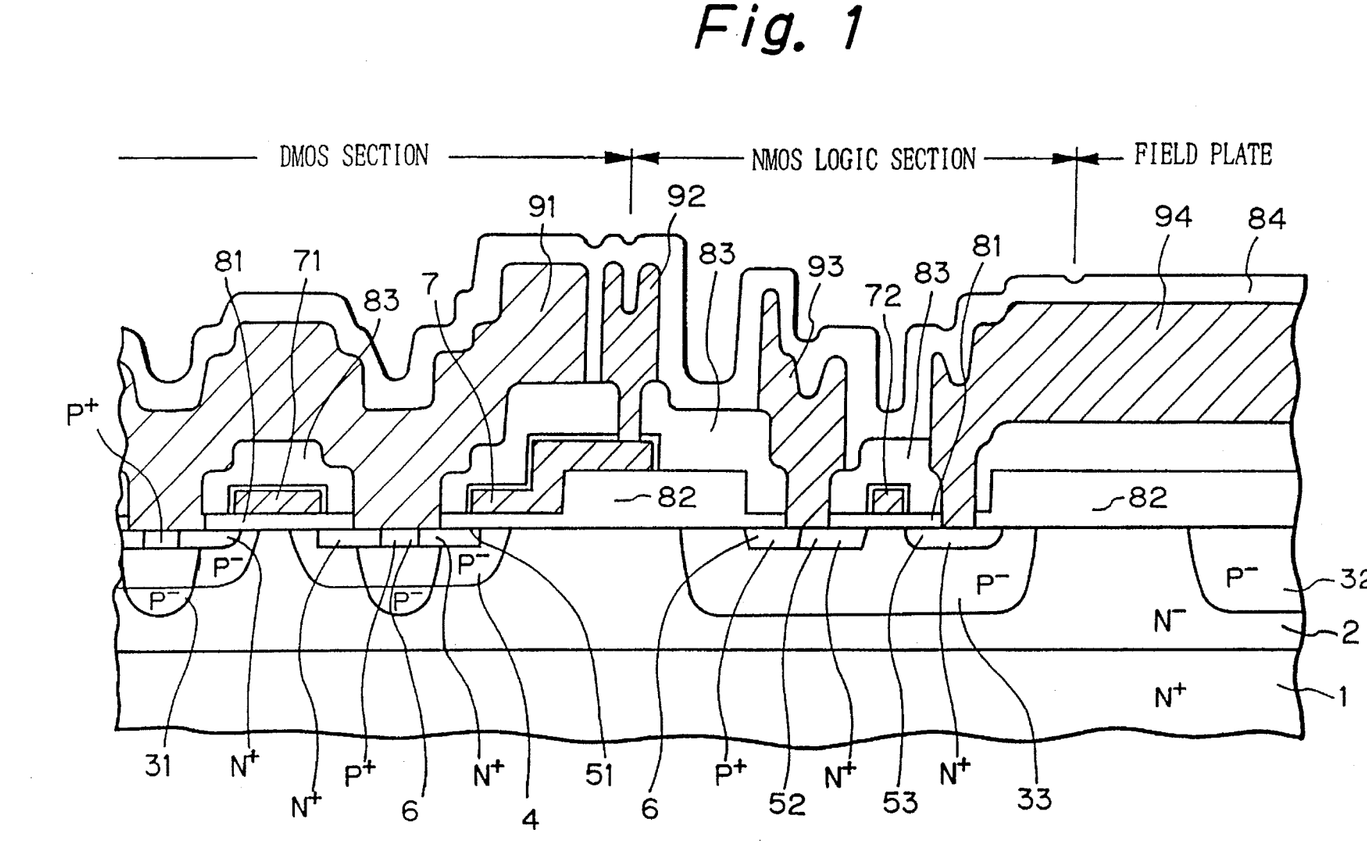
FIG. 1 is a sectional view showing part of a semiconductor device according to a first embodiment of the present invention.

FIG. 1 is a sectional view showing part of a semiconductor device according to the first embodiment of the present invention.

The semiconductor device includes an $n^+$ silicon substrate (semiconductor substrate) 1 acting as a drain of each DMOS transistor, an $n^-$ epitaxial layer (simply called the layer in Claims) 2, a deep $p^-$ well (main well) 31 of the DMOS transistor, a deep $p^-$ well (subwell) 33 of an NMOS logic section (control element), a $p^-$ channel well 4 serving as a main current section, an $n^+$ source 51 of the DMOS transistor, an $n^+$ source 52 of the NMOS logic section, an $n^+$ drain 53 of the NMOS logic section, a $p^+$ well contact 6, a gate electrode 71 made of doped polysilicon of the DMOS transistor, a gate electrode 72 made of doped polysilicon of the NMOS logic section, a gate insulation film 81 made of a silicon oxide film, a thick silicon oxide film (field insulation film) 82, a layer insulation film 83 made of BPSG, a passivation insulation film 84 made of P-SiN, and aluminum electrodes 91 to 94.

This semiconductor device is an integration of the DMOS transistors and planar NMOS transistors. Each of the DMOS transistors has a source 51, drain provided by the substrate 1, and gate electrode 71. The planar NMOS transistor has a source 52, drain 53, and gate electrode 72.

In the main well 31, the $n^+$ source 51 and $p^-$ channel well 4 are formed by double ion implantation through openings formed through the gate electrode 71. The $n^+$ source 52 is formed on the $p^-$ subwell 33 during the implantation process for forming the $n^+$ source 51. The $p^-$ subwell 33 is formed by the same ion implantation process that forms the $p^-$ main well 31.

According to this embodiment, the DMOS sections form a main current section. Each of the DMOS sections has channel wells 4 to determine the threshold voltage Vt of the DMOS section. Each of the channel wells 4 has a square plan view. On the channel wells 4, the gate electrode 71 is disposed. The gate electrode 71 is wide and has many square openings used for the double ion implantation process.

The subwell 33 is surrounded by the thick field insulation film 82. The field insulation film 82 reduces the influence of the gate electrode 71, etc., on the $n^-$ epitaxial layer 2 just below the field insulation film 82, thereby preventing the surface of the epitaxial layer 2 from inverting to "p" to conduct the channel wells 4 with the subwell 33.

A $p^-$ well 32 for reducing an electric field intensity is formed together with the wells 31 and 33 in the $n^-$ epitaxial layer 2.

Processes of producing this semiconductor device will be explained with reference to FIGS. 2 to 15.

Figure 2:
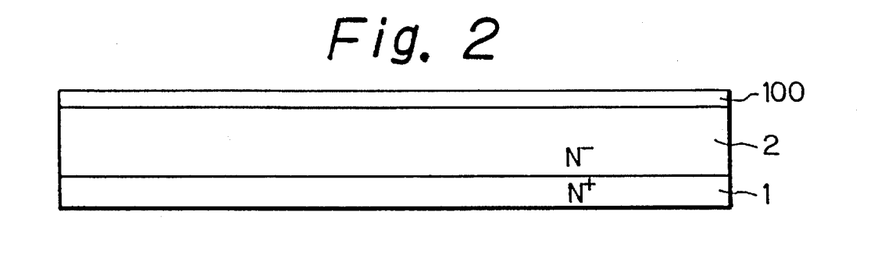
FIGS. 2 to 15 are sectional views showing processes of producing the semiconductor device of FIG. 1.

In FIG. 2, an arsenic doped $n^+$ silicon substrate 1 having a specific resistance of 0.005 $\Omega \cdot$cm or smaller is prepared. A phosphorus doped $n^-$ epitaxial layer 2 of $5 \times 10^{15}$ atoms/cm$^3$ is formed over the substrate 1 to a thickness of 8.6 µm. A silicon oxide film 100 of about 4500 angstroms thick is formed over the epitaxial layer 2 by wet oxidation at 1050 degrees centigrade for 80 minutes.

In FIGS. 3 through 15, the $n^+$ silicon substrate 1 is omitted for the sake of simplicity.

Figure 3:
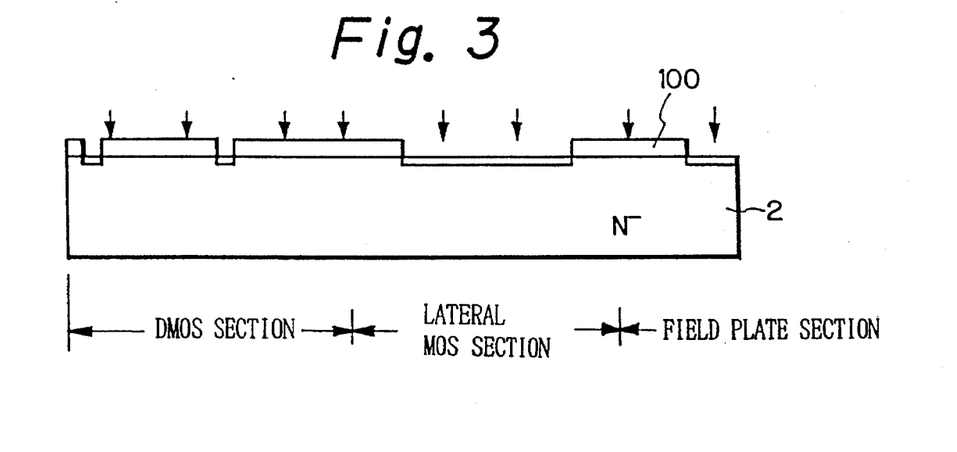

In FIG. 3, deep $p^-$ wells 31, 32, and 33 are formed. Namely, the silicon oxide film 100 is photoetched to form open grooves, and boron ions are implanted at $3 \times 10^{13}$ dose/cm$^2$ and 60 keV.

Figure 4:
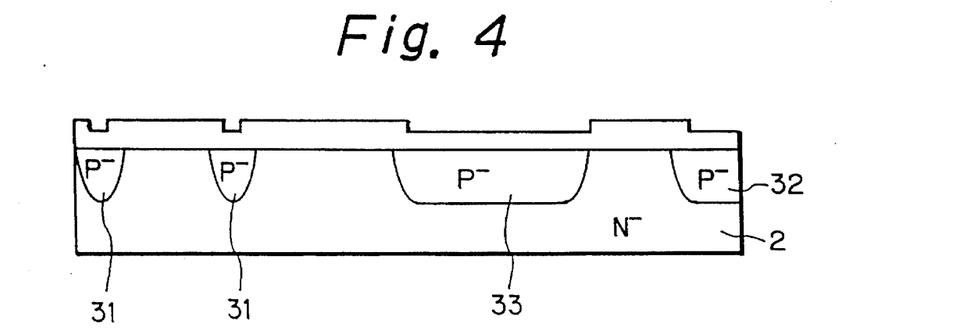

In FIG. 4, a drive-in process is carried out at 1170 degrees centigrade for four hours in an oxidizing $CN_2$ atmosphere, to form the deep $p^-$ wells, i.e., the main well 31, subwell 33, and electric field intensity reducing well 32 to a depth of Xj (3.6 µm).

Figure 5:
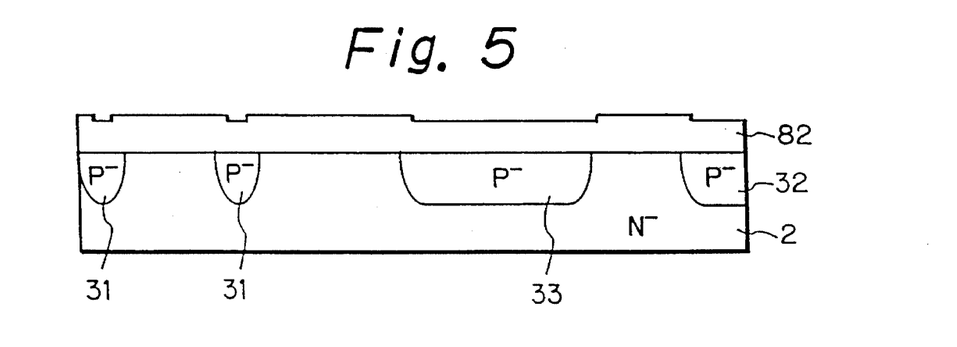

In FIG. 5, the silicon oxide film 100 is removed. The sample is oxidized at 1050 degrees centigrade to form a silicon oxide film 82 of about 4500 angstroms thick.

Figure 6:
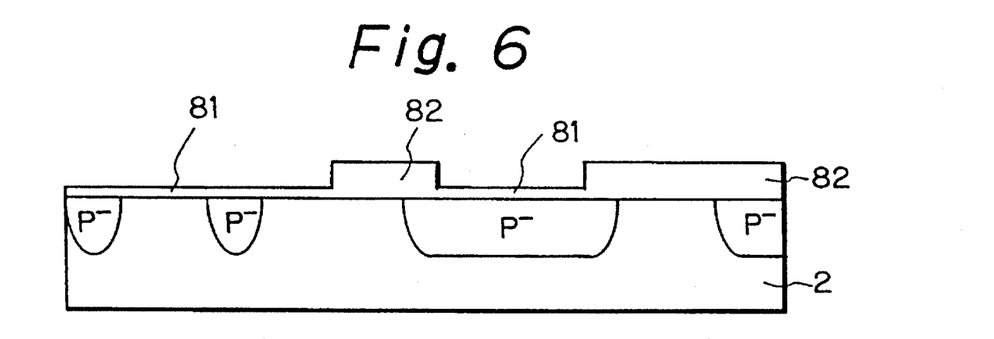

In FIG. 6, the silicon oxide film 82 is patterned by photolithography, to form a field insulation film 82. At each opening of the field insulation film 82, the surface of the epitaxial layer 2 is thermally oxidized to form a gate insulation film 81 of 600 angstroms in thickness.

Figure 7:
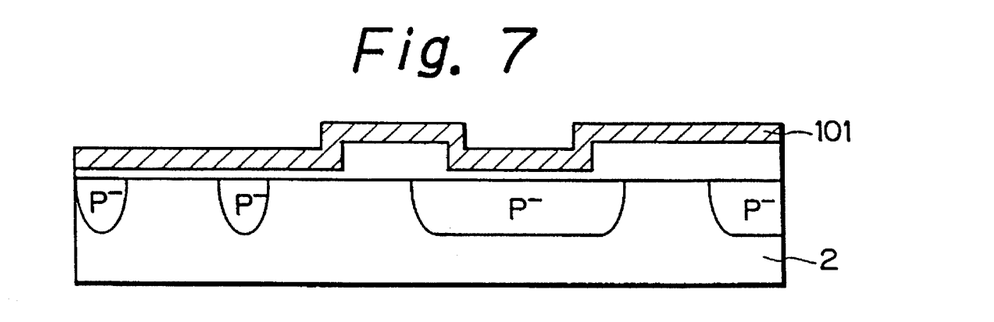

In FIG. 7, a polysilicon film 101 is deposited to a thickness of 3700 angstroms by LPCVD and phosphorus diffusion.

Figure 8:
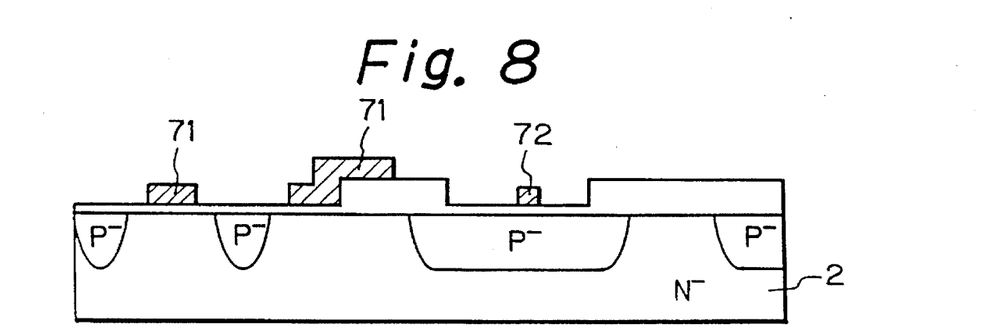

In FIG. 8, the polysilicon film 101 is patterned by photolithography and is dry-etched to form gate electrodes 71 and 72. The gate electrode 71 has openings on and around the main well 31.

Figure 9:
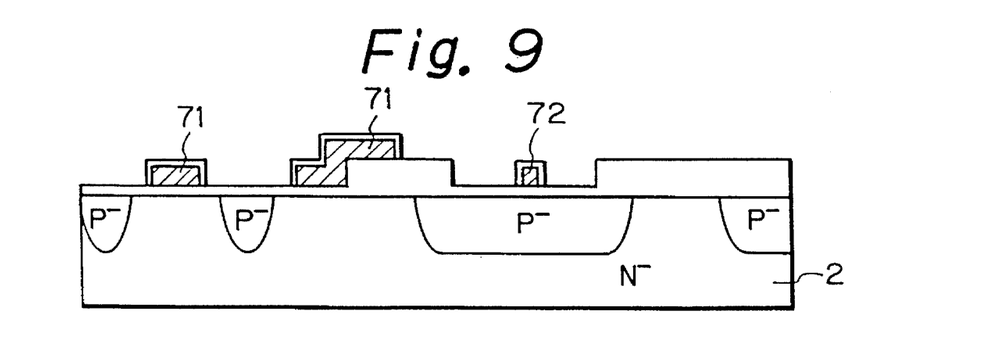

In FIG. 9, the surfaces of the gate electrodes 71 and 72 are oxidized to form a protective insulation film of 600 angstroms in thickness. The oxidation is carried out at 1000 degrees centigrade for fifty minutes.

Figure 10:
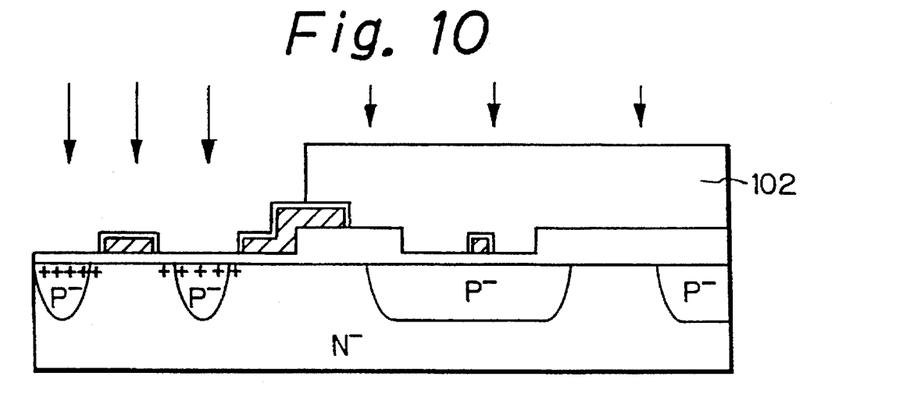

In FIG. 10, a resist mask 102 covers the surface of the sample except the DMOS area, and boron ions are implanted at $1 \times 10^{14}$ does/cm$^2$ and 130 keV. The gate electrode 71 serves as a mask for self-alignment during the ion implantation.

Figure 11:
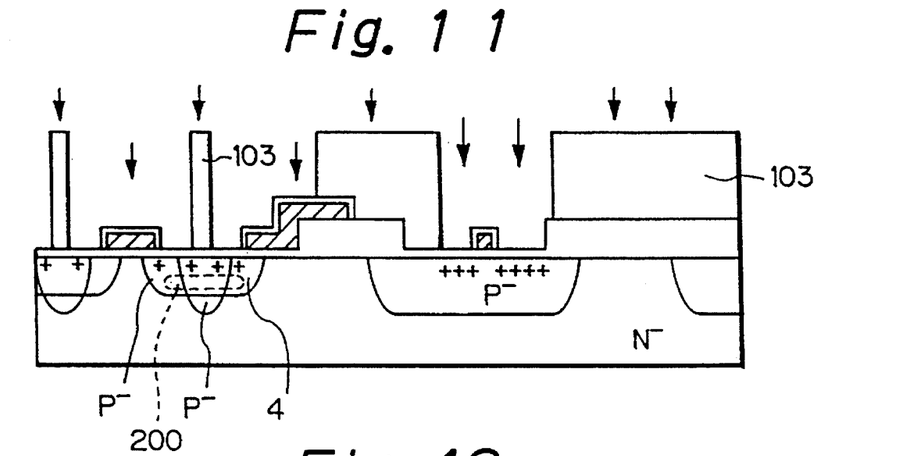

In FIG. 11, the implanted boron ions are subjected to a drive-in process at 1170 degrees centigrade for about 100 minutes, to form a $p^-$ channel well 4 having a depth of xj (2.6 µm). A mask 103 is formed and patterned by photolithography. Phosphorus ions are implanted to the surface of the $p^-$ channel well 4 and to the surface of a source/drain forming area of an NMOS transistor, at $4 \times 10^{15}$ dose/cm$^2$ and 100 keV.

Figure 12:
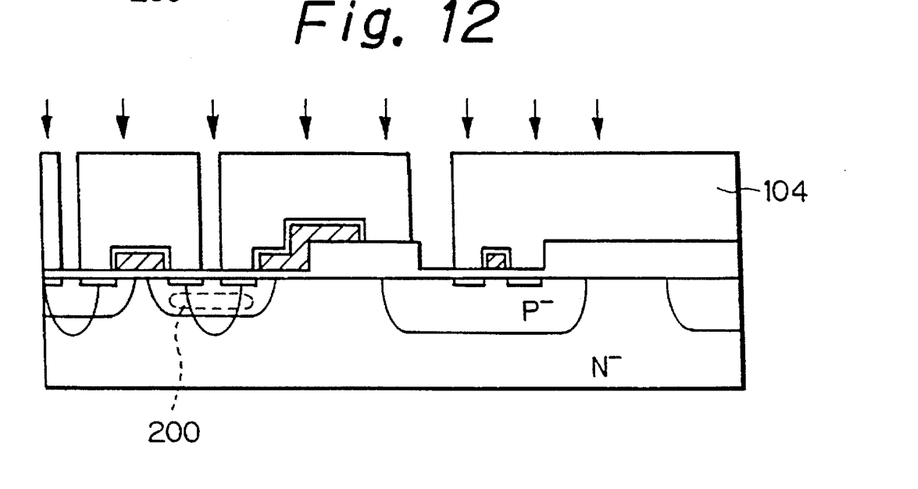

In FIG. 12, the mask 103 is removed, and a well contact forming resist mask 104 is formed. Boron ions are implanted at $6 \times 10^{14}$ dose/cm$^2$ and 40 keV.

Figure 13:
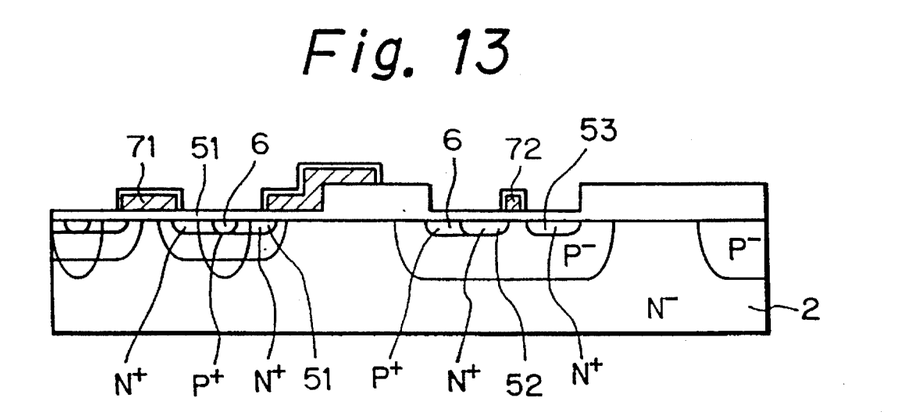

In FIG. 13, the resist mask 104 is removed. A drive-in process is carried out in an $N_2$ atmosphere, to form $n^+$ sources 51 and 52, an $n^+$ drain 53, and $p^+$ contacts 6. The drive-in process is continued for one hour at 1050 degrees centigrade, to form the regions 51, 52, 53, and 6 to a depth of xj (about 1.0 µm). An end of the $n^+$ source 51 beside the gate electrode 71, is defined by the gate electrode 71 irrespective of the shape of the mask. Accordingly, the channel length of the DMOS cell under the gate electrode 71 is determined by a difference between widths due to the two ion implantation operations.

Figure 14:
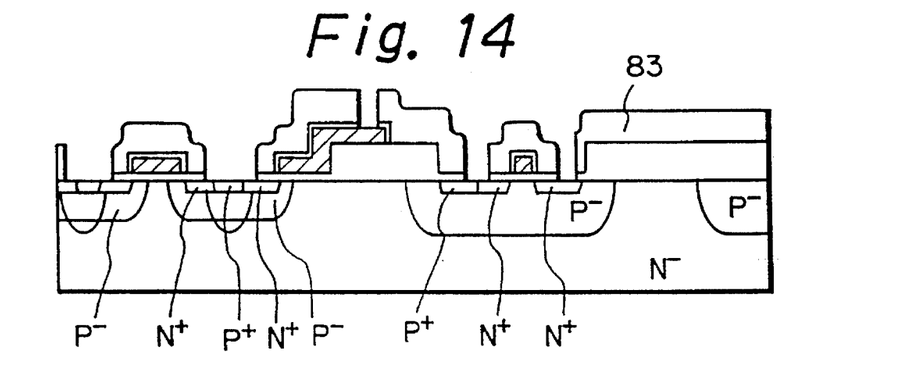

In FIG. 14, a BPSG film is entirely deposited to about 7000 angstroms by CVD, to form a layer insulation film 83. Predetermined parts of the layer insulation film 83 are removed by photolithography, to form contact openings.

Figure 15:
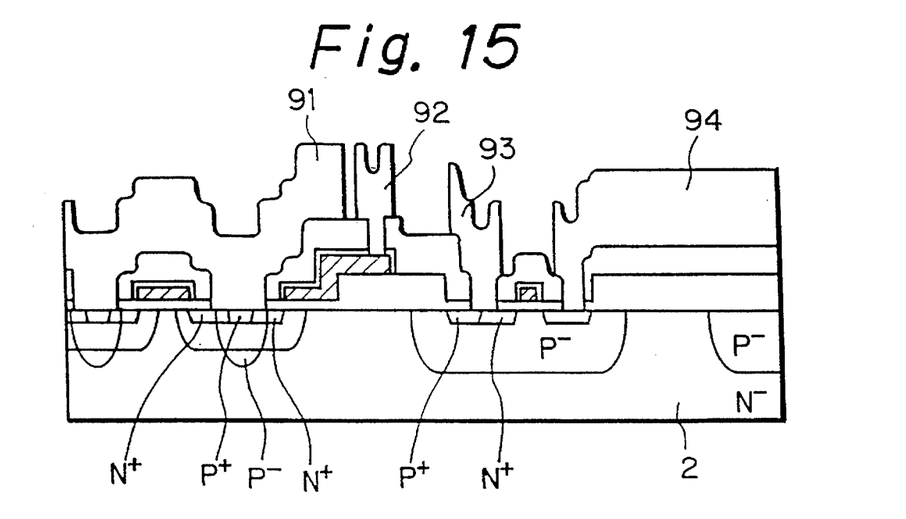

In FIG. 15, electrodes 91 to 94 having predetermined wiring patterns are formed from aluminum-silicon to a thickness of 4 to 5.5 µm. The electrodes include the source electrode 91 of the DMOS transistor, the gate electrode 92 of the DMOS transistor, the source electrode 93 of the NMOS transistor, and the drain electrode 94 of the NMOS transistor.

A passivation film 84 is deposited on the sample as shown in FIG. 1, and a metal film serving as a drain electrode of the DMOS transistor is deposited on the back of the sample. In this way, a semiconductor device having integrated lateral NMOS and vertical DMOS power transistors is produced.

Operation of this device will be explained.

The electrode 91 is grounded. The substrate 1 is connected to a positive potential source through a reactive load. An intermittent control voltage is applied to the gate electrode 71. When a positive high level potential is applied to the gate electrode 71, the source 51 becomes conductive to the n$^+$ substrate 1 through an n channel at the surface of the channel well 4.

When the gate voltage is brought to a low level to turn OFF the DMOS transistor, a counter electromotive force of the reactive load causes the potential of the substrate 1 to increase. As a result, each electric field at a junction depletion layer, between the wells 31, 33 and the epitaxial layer 2, respectively, becomes intense enough to cause the reach-through phenomenon.

Since the channel well 4 is overlapping with the main well 31 of the DMOS transistor, the growth of the junction depletion layer of the DMOS transistor is suppressed, so that the DMOS transistor may have a lower reach-through withstand voltage than the NMOS transistor.

It is preferable that the DMOS transistor has a lower reach-through withstand voltage because it prevents a reach-through phenomenon at the NMOS transistor which has a lower allowable current. To make the reach-through withstand voltage of the DMOS transistor be sufficiently lower than that of the NMOS transistor, impurity concentration in the p$^-$ channel well 4 must be sufficiently higher than that in the main well 31. This, however, increases the threshold voltage Vt of the DMOS transistor, to hinder the operation of the semiconductor device with a low source voltage.

Accordingly, the present invention employs a higher acceleration voltage of 130 keV instead of a conventional acceleration voltage of 40 keV, to implant boron ions to form the p$^-$ channel well 4. This results in deepening an average implantation depth of the boron ions. A drive-in process to be carried out thereafter makes boron concentration at the surface of the channel well 4 thinner than that at the internal of in the channel well 4. This results in reducing the threshold voltage Vt of the DMOS transistor without increasing the reach-through withstand voltage of the same transistor.

According to the present invention, it is preferred to form the channel well 4 with an ion acceleration voltage of 100 keV or over.

TABLE 1

| | Dose/cm$^2$ Surface atoms cm$^{-3}$ | DMOS For p$^-$channel well | | NMOS |
|---|---|---|---|---|
| | (Surface) | 40 keV | 130 keV | |
| a | 3 × 10$^{13}$ | 83.7 V | 80.7 V | 86.0 V |
| | 6.4 × 10$^{16}$ | Reach-through | | |
| b | 2 × 10$^{13}$ | 86.4 V | 82.6 V | 91.8 V |
| | 4.0 × 10$^{16}$ | Reach-through | | |
| c | 1 × 10$^{13}$ | 87.6 V | 83.4 V | 108 V |
| | 1.6 × 10$^{16}$ | Surface breakthrough | | |
| | Main/subwell concentration | Channel well: 7 × 10$^{13}$ dose/cm$^2$ Main well and subwell: 40 keV | | |

Figure 16:
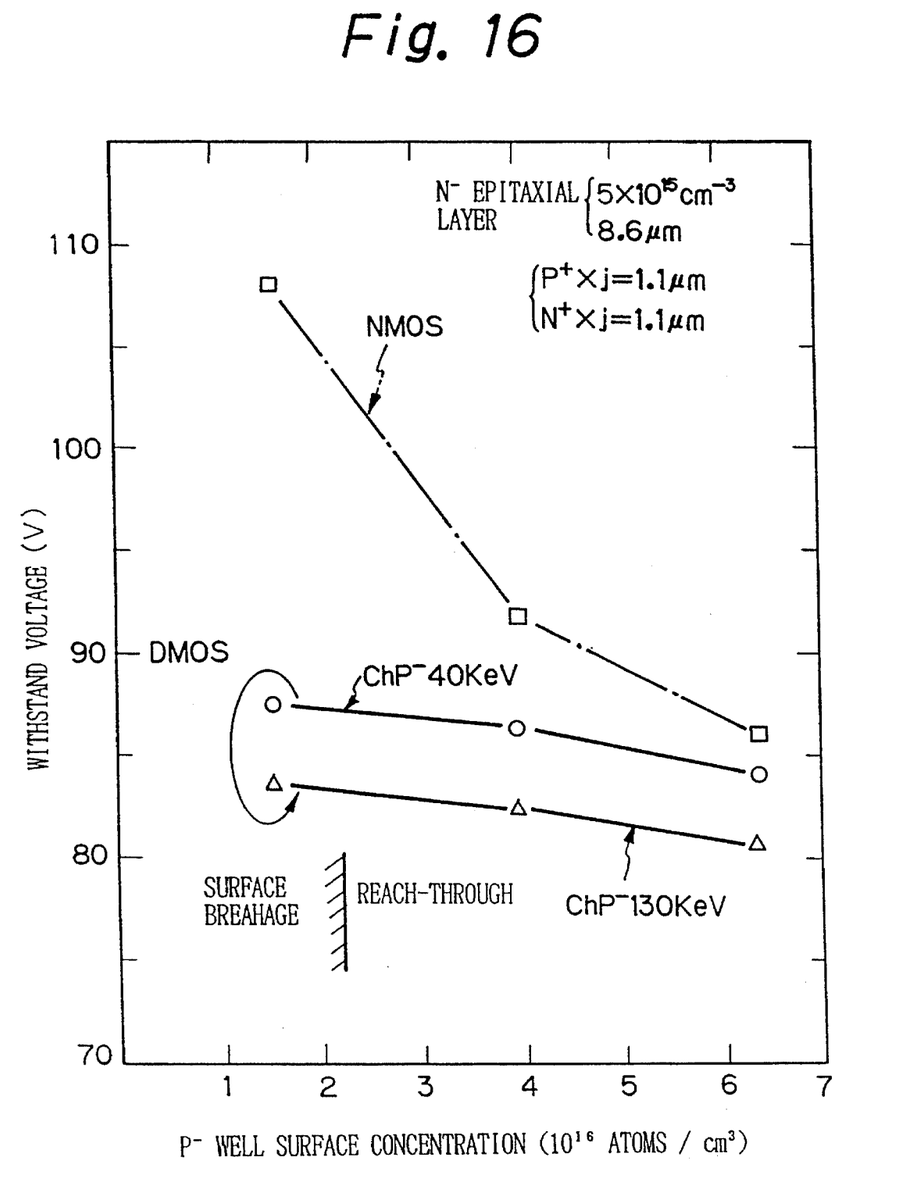
FIG. 16 is a diagram showing a relationship between the surface concentration and reach-through withstand voltages of $p^-$ main well and subwell.

Table 1 shows simulation results of channel wells 4 formed under different conditions. FIG. 16 is a graph showing the same results. The simulations are based on samples each having an n$^+$ substrate of 10$^{20}$ atoms/cm$^3$ or more, an n$^-$ epitaxial layer of 5×10$^{15}$ atoms/cm$^3$ and 8.6 μm thick on the substrate, p$^-$ main well and subwell of (1, 2, or 3)×10$^{13}$ dose/cm$^2$ formed with 40 keV in acceleration voltage, a p$^-$ channel well of 7×10$^{13}$ dose/cm$^2$ and Vt=1.8 V formed with (40 or 130) keV in acceleration voltage. Sources 51 and 52 and p$^+$ contacts 6 of the samples are each 1.1 μm depth.

Table 1 and FIG. 16 show that, when the ion acceleration voltage for forming the channel well 4 is increased from 40 keV to 130 keV, the reach-through withstand voltage of the DMOS transistor decreases to sufficiently expand a difference from that of the NMOS transistor, thereby to prevent the NMOS transistor from absorbing a current due to a back electromotive force of a reactive load.

FIG. 16 and Table 1 also show that, when the quantities of ions implanted to form the main well 31 and subwell 33 are reduced, for example, from the example "a" to the example "c" of Table 1, the reach-through withstand voltages of the DMOS and NMOS transistors increase. An increase in the withstand voltage of the DMOS transistor is smaller, due to the channel well 4, than in that of the NMOS transistor. Accordingly, when the quantities of ions to be implanted to the main well 31 and subwell 33 are simultaneously reduced, the allowable current of the device will improve.

In the example "c" of Table 1, the main well 31 is formed at 1×10$^{13}$ dose/cm$^2$ and 40 keV, and a breakdown occurs on a junction depletion layer on the epitaxial layer 2. It is preferable not to reduce the impurity concentration of the main well 31 and subwell 33 to an extent that causes such surface break-through.

Results of various tests show that if a difference between the reach-through withstand voltage of a DMOS transistor and that of an NMOS transistor is 5 V or more, the DMOS transistor can absorb a current due to a back electromotive force of a reactive load before the NMOS transistor the reach-through phenomenon at the NMOS transistor occurs.

When ions are implanted to the channel well 4 at an acceleration voltage of 40 keV so that ion concentration at the surface of the channel well 4 may be denser than that inside the channel well 4, the reach-through withstand voltage difference of 5 V will be secured, if the main well 31 and subwell 33 receive 2×10$^{13}$ dose/cm$^2$.

According to the first embodiment of the present invention, the high concentration contact 6 of second conduction type is formed in the subwell 33, and the contact 6 of second conductivity type is formed in the source 51 in the channel well 4.

According to the first embodiment, a high concentration horizontal distribution (internal layer) 200 is formed in the channel well 4. The internal layer 200 uniformly spreads in the channel well 4 below the contact 6 and in parallel with the bottom of the channel well 4.

The internal layer 200 may be formed by increasing an ion acceleration voltage for implanting ions of the second conductivity type in the channel well forming process higher than an ion acceleration voltage for implanting ions of the second conduction type in the well-forming process.

(Second embodiment)

A semiconductor device according to the second embodiment of the present invention will be explained with reference to FIGS. 17 to 19 and 21.

Figure 21:
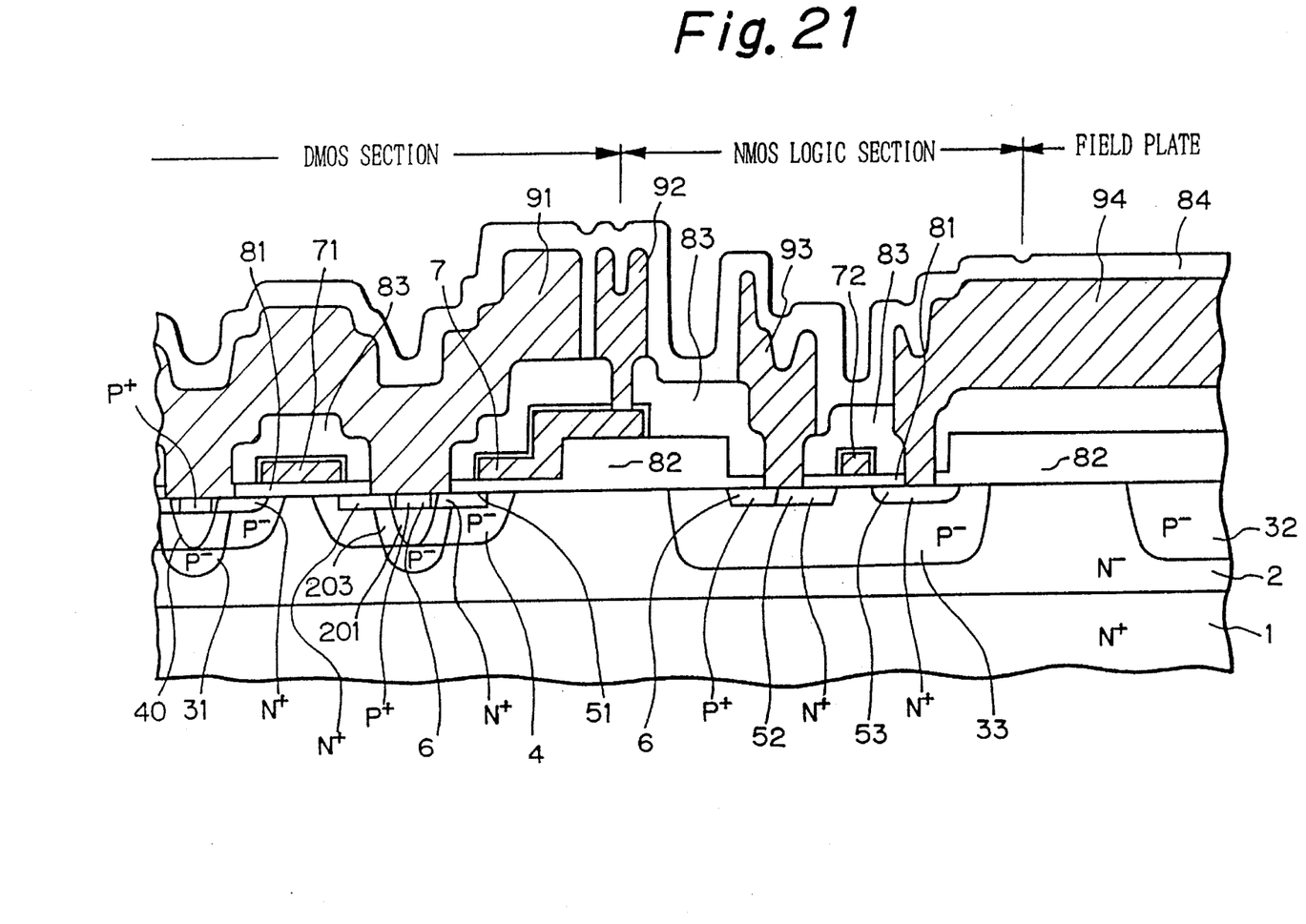
FIG. 21 is a sectional view showing part of the semiconductor device according to the second embodiment.

Referring to FIG. 21, the semiconductor device of the second embodiment is characterized in that a channel well 4, which corresponds to the channel well 4 of the first embodiment, has a high concentration internal columnar well 201 of the second conductivity type. The columnar well 201 is formed in an area 203 where a main well 31 overlaps the channel well 4. The columnar well 201 extends from a part of the surface of the channel well 4 toward the inside thereof.

The semiconductor device according to the second embodiment is produced in a similar way to the semiconductor device of the first embodiment.

Figure 17:
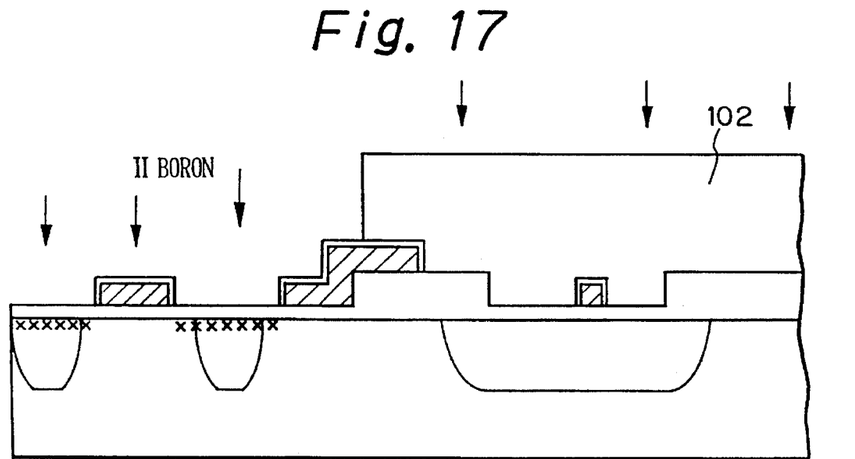
FIGS. 17 to 19 are sectional views showing processes of producing a semiconductor device according to a second embodiment of the present invention.

In FIG. 17, boron ions are implanted to form a channel well 4. In this embodiment, the ion implantation is carried out with a standard acceleration voltage of 40 keV.

Figure 18:
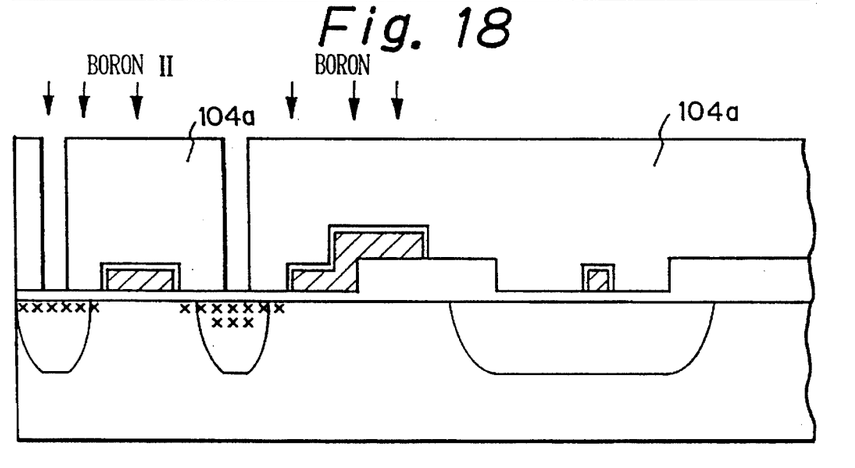

In FIG. 18, a mask 104a is used to deeply and densely implant boron ions with a high acceleration voltage of, for example, 100 keV. The mask 104a corresponds to the mask 104 of FIG. 12 used for forming the p$^+$ contacts 6 of the first embodiment.

Figure 19:
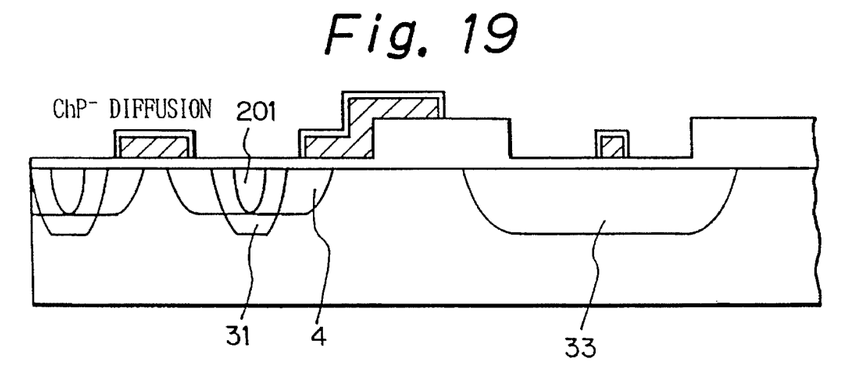

In FIG. 19, a drive-in process is carried out on the implanted boron ions to form a deep p$^+$ high concentration internal columnar well 201 only in a DMOS section.

Thereafter, the same processes as those of FIGS. 11 to 15 are carried out, to form the semiconductor device of FIG. 21.

According to this embodiment, the reach-through withstand voltage of each DMOS transistor will not increase even if the threshold voltage Vt thereof decreases. This embodiment increases the degree of freedom in designing the withstand voltages of DMOS and NMOS transistors. The p$^+$ internal columnar well 201 may be formed after forming the n$^+$ source layer 51.

Instead of using the mask 104a for implanting ions to form the p$^+$ columnar well 201, different masks may be used for preparing the p$^-$ main well 31 and subwell 33, respectively. The dose of ions for the main well 31 must be greater than that for the subwell 33. It is preferable to carry out a drive-in process on both the wells 31 and 33 at the same time. For example, before simultaneously forming the main well 31 and subwell 33, a mask for reducing ions may be formed over an area where the subwell 33 is to be formed.

A method for producing the semiconductor device according to the second embodiment of the present invention includes the steps of:

preparing a high concentration semiconductor substrate of the first conductivity type, forming a low concentration layer of the first conductivity type over the substrate, and implanting ions to form a deep well for a vertical semiconductor device (a main well) of the second conductivity type as well as a well for a semiconductor island (a subwell) of the second conductivity type in the layer;

forming a gate electrode for the main well except in the main well area, interposing a gate insulation film therebetween on the layer;

forming a channel well of the second conductivity type such that an edge of the channel well extends under the gate electrode and such that the channel well overlaps the main well and is shallower than the main well;

implanting ions, using a proper mask, to a part of an area where the channel well overlaps the main well, to form a high concentration internal columnar well extending from the surface of the layer toward the inside thereof; and forming a high concentration source of first conductivity type on the channel well such that an edge of the source extends under the gate electrode and such that the source is shallower and narrower than the channel well.

Similar to the first embodiment, the second embodiment forms sources 51 and 52 in the channel well 4 and subwell 33, respectively, and contacts 6 of the second conductivity type in the channel well 4 and subwell 33, respectively.

According to the second embodiment, the internal columnar well 201 includes the contact 6 of second conductivity type. Accordingly, the columnar well 201 is formed in the channel well 4 before forming the sources and contacts. Alternatively, the columnar well 201 may be formed after forming the sources and contacts.

(Third embodiment)

Figure 22:
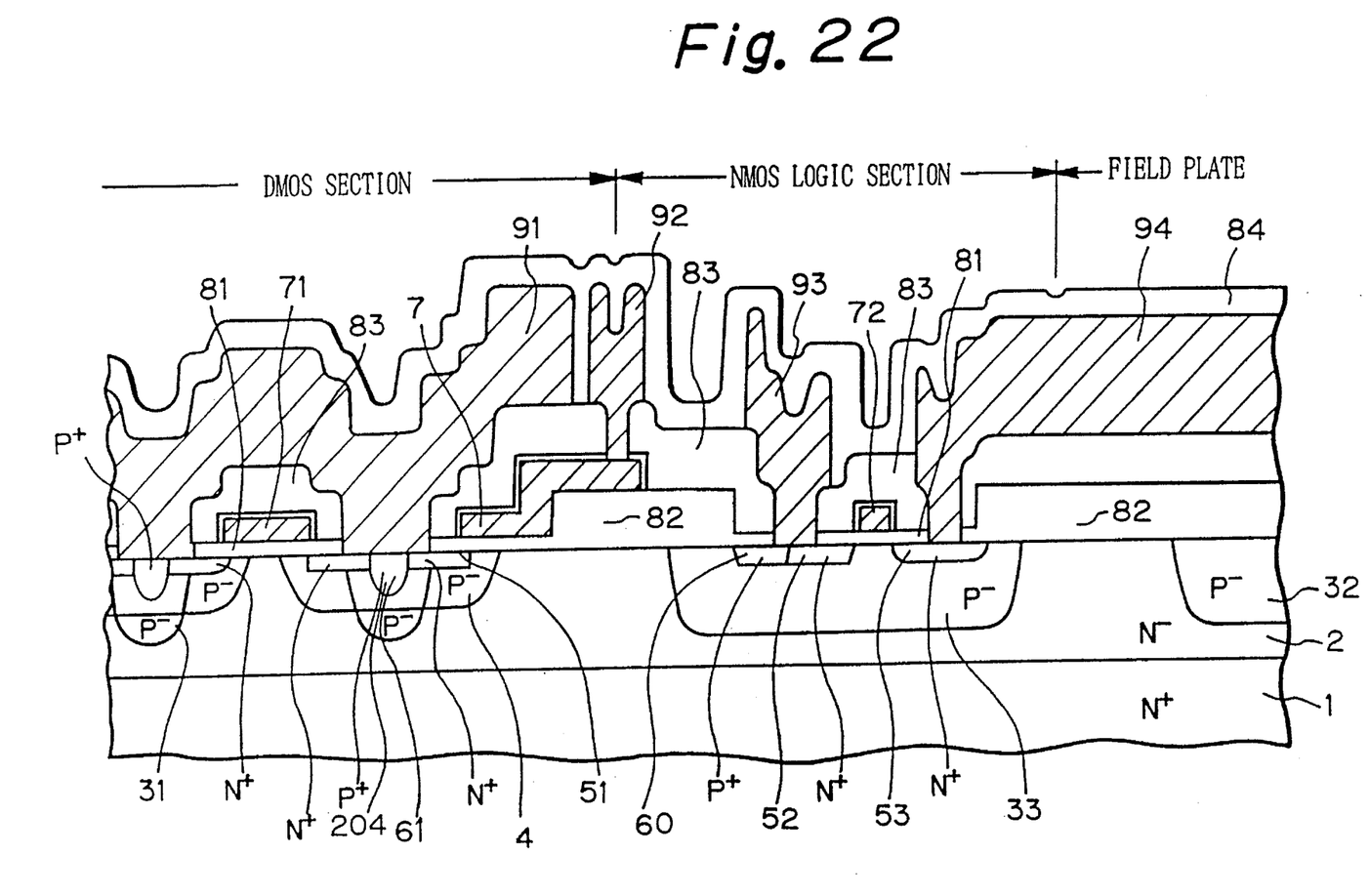
FIG. 22 is a sectional view showing part of a semiconductor device according to a third embodiment of the present invention.

The third embodiment of the present invention will be explained with reference to FIG. 22.

According to the first and second embodiments, the dose of ions and the ion acceleration voltage for the channel well 4 or for the wells 31 and 33 are controlled to increase the difference between the reach-through voltages of the DMOS and NMOS transistors. The same difference increasing effect may be provided by separately doping the p$^+$ contacts 6 of the DMOS and NMOS transistors.

Namely, a semiconductor device according to the third embodiment of the present invention has:

a high concentration semiconductor substrate of the first conductivity type serving as a drain and having on the surface thereof a low concentration layer of the first conductivity type;

a deep main well 31 of the second conduction type formed in a vertical semiconductor device forming area in the layer;

a gate electrode 7 (71) formed on a gate insulation film on the layer, except in the main well area;

a channel well 4 of the second conductivity type, overlapping the main well 31 and being shallower than the main well 31, an edge of the channel well 4 extending under the gate electrode;

a high concentration source 51 of the first conductivity type formed in the channel well 4 such that the source 51 is shallower and narrower than the channel well 4 and extends under the gate electrode; and a subwell 33 of the second conductivity type formed by doping the same impurities as for the main well 31 to a semiconductor island forming area in the layer.

A contact 61 of the second conductivity type is formed above the bottom of the main well 31 in the channel well 4. The contact 61 has a columnar shape extending from the surface of the channel well 4 toward the inside thereof. The contact 61 forms a high concentration internal well 204, which is deeper than a contact 60 of the subwell 33.

The p$^+$ contact 61 of each DMOS transistor may be formed by high concentration doping with use of a first mask, and the p$^+$ contact 60 of NMOS transistor may be formed by low concentration doping with use of a second mask. At this time, the low concentration doping for the contact 60 must not be too low to reduce the effectiveness of the contact. After a drive-in process, the contact 61 becomes deeper than the contact 60 due to the high impurity concentration, thereby to reduce the reach-through voltage of the DMOS transistor. Namely, this embodiment increased the difference between the reach-through voltages by separately forming the contacts of the main well and subwell.

The same effect may be achieved by increasing an ion acceleration voltage for the p$^+$ contact 61 of each DMOS transistor higher than that for the p$^+$ contact 60 of NMOS transistor. In this case, the dose of ions implanted in the p$^+$ contact 61 must be selected not to deteriorate the characteristics of the p$^+$ contact 61.

Both of the acceleration voltage and dose may be changed when implanting ions to the p$^+$ contacts 61 and 60 of DMOS and NMOS transistors.

A method for producing the semiconductor device according to the third embodiment of the present invention includes the steps of:

preparing a high concentration semiconductor substrate of the first conductivity type, forming a low concentration layer of the first conduction type over the substrate, and implanting ions to form a deep main well in a vertical semiconductor device forming area (a main well) of the second conductivity type as well as a bubwell in a semiconductor island forming area (a subwell) of the second conductivity type in the layer;

forming a gate electrode for the main well, on a gate insulation film on the layer, except in the main well area;

forming a channel well of the second conductivity type such that an edge of the channel well extends under the gate electrode and such that the channel well overlaps the main well and is shallower than the main well;

forming a high concentration source of the first conductivity type in the channel well such that an edge of the source extends under the gate electrode and such that the source is shallower and narrower than the channel well; and forming a contact in the vicinity of or in the middle of the source by making the doping quantity of ions, or an ion acceleration voltage for a contact forming area in the main well, higher than the doping quantity of ions or an ion acceleration voltage for a contact forming area in the subwell.

Although the above embodiments relate to intelligent power elements employing n-channel DMOS and NMOS transistors, the present invention is also applicable for a combination of p-channel DMOS and PMOS transistors. According to the present invention, the subwell 33 may involve other types of integrated semiconductor elements. The present invention is also applicable for a CMOS structure, a combination of n-channel DMOS and NMOS wells, and a combination of p-channel DMOS and PMOS wells.

We claim:

1. A method of forming a semiconductor device, comprising the steps of:

preparing a semiconductor substrate of a first conductivity type, having a separate layer of said first conductivity type formed on a top surface of said semiconductor substrate, said semiconductor substrate having a concentration higher than that of said layer, and implanting ions to form a main well in a vertical semiconductor device forming area on which a first control element having a first allowable current is formed, as well as a subwell in a semiconductor island forming area on which a second control element is formed having MOS construction, said second control element having a second allowable current which is smaller than said first current and a withstand voltage between a source and drain thereof which is higher than a withstand voltage of said control element having said first allowable current;

forming a gate electrode on a gate insulation film formed on said layer, in the vertical semiconductor device forming area except over said main well;

forming a channel well of said second conductivity type such that an edge of said channel well extends under said gate electrode and such that said channel well overlaps said main well and is shallower than said main well, and a center portion of said channel well includes a high concentration section to form an internal well having higher concentration than said main well, said channel well being formed after said main well and said subwell are formed; and forming another source of said first conductivity type in said channel well such that an edge of said another source extends under said gate electrode and such that said another source is shallower and narrower than said channel well wherein the concentration of said another source is higher than that of said layer over said semiconductor substrate.

2. A method of forming a semiconductor device, comprising the steps of:

preparing a semiconductor substrate of a first conductivity type, forming a layer of said first conductivity type over said semiconductor substrate, said semiconductor substrate having a higher concentration than said layer, and implanting ions to form a main well in a vertical semiconductor device forming area on which a first control element having a first allowable current is formed, as well as a subwell in a semiconductor island forming area on which a second control element is formed, said second control element having MOS construction, a second allowable current which is smaller than said first allowable current and a withstand voltage between a source and drain thereof which is higher than a withstand voltage of said first control element;

forming a gate electrode on a gate insulation film formed on said layer, in the vertical semiconductor device forming area except over said main well;

forming a channel well of a second conductivity type such that an edge of said channel well extends under said gate electrode and such that said channel well overlaps said main well and is shallower than said main well;

forming an internal well of said second conductivity type in a center portion of said channel well, said internal well having a higher concentration than said main well and being formed after said main well and said subwell are formed; and forming another source of said first conductivity type in said channel well such that an edge of said another source extends under said gate electrode and such that said another source is shallower and narrower than said channel well, wherein the concentration of said another source is higher than that of said layer over said semiconductor substrate.

3. A method of forming a semiconductor device according claim 2, wherein a DMOS transistor portion is formed in a region of said main well and an NMOS logic portion is formed in a region of said subwell.

4. A method of forming a semiconductor device according to claim 2, wherein said main well is formed in a main well region, and said subwell is formed in a subwell region, and wherein said main well region and said subwell region are formed so that said first control element shows a reach-through phenomenon earlier than said subwell region, when both said main well and said subwell regions are biased with an identical voltage.

5. A method of forming a semiconductor device, comprising the steps of:

preparing a semiconductor substrate of a first conductivity type, forming a layer of said first conductivity type over said semiconductor substrate, said semiconductor substrate having a higher concentration than said layer, and implanting ions to form a main well in a vertical semiconductor device forming area on which a first control element having a first allowable current is formed, as well as a subwell in a semiconductor island forming area on which a second control element having a second allowable current is formed, said second allowable current being smaller than said first allowable current;

forming a gate electrode on a gate insulation film formed on said layer, in said vertical semiconductor device forming area except over said main well; and forming a channel well of a second conductivity type such that an edge of said channel well extends under said gate electrode and such that said channel well overlaps said main well and is shallower than said main well, said channel well being formed after said main well and said subwell are formed;

forming a source of said first conductivity type on said channel well such that an edge of said source extends under said gate electrode and such that said source is shallower and narrower than said channel well, wherein the concentration of said source is higher than that of said layer over said semiconductor substrate, said channel well forming step having an ion acceleration voltage for implanting ions of said second conductivity type higher than an ion acceleration voltage for implanting said ions of said second conductivity type in the main well forming step, so that the concentration distribution of said ions within said channel well becomes denser toward the inside of said channel well.

6. A method of forming a semiconductor device according to claim 5, wherein a DMOS transistor portion is formed in a region of said main well and an NMOS logic portion is formed in a region of said subwell.

7. A method of forming a semiconductor device according to claim 5, wherein said main well is formed in a main well region, and said subwell is formed in a subwell region, and wherein said main well region and subwell region are formed so that a difference between the reach-through withstand voltage of said first control element and the reach-through-voltage of said second control element is at least 5 V.

8. A method of forming a semiconductor device according to claim 7, wherein said main well and said subwell are formed in regions each having $3\times10^{13}$ dose/cm$^2$.

9. A method of forming a semiconductor device according to claim 5, wherein said main well is formed in a main well region, and said subwell is formed in a subwell region, and wherein said main well region and said subwell region are formed so that said first control element shows a reach-through phenomenon earlier than said subwell region, when both said main well region and said subwell region are biased with an identical voltage.

10. A method for forming a semiconductor device, comprising the steps of:

preparing a semiconductor substrate of a first conductivity type, forming a layer of said first conductivity type over said semiconductor substrate, said semiconductor substrate having a higher concentration than said layer, and implanting ions to form a main well of a second conductivity type in a vertical semiconductor device forming area on which a first control element having a first allowable current is formed as well as a subwell in a semiconductor island forming area on which a second control element having a second allowable current is formed, said second allowable current being smaller than said first allowable current;

forming a gate electrode on a gate insulation film formed on said layer, in the vertical semiconductor device forming area except over said main well;

forming a channel well of said second conductivity type such that an edge of said channel well extends under said gate electrode and such that said channel well overlaps said main well and is shallower than said main well accompanied by the process of selectively implanting other ions in a center portion of said channel well with the use of a mask, to form an internal columnar well extending from the surface of said layer toward the inside thereof and having a higher concentration than said main well, said internal columnar well being formed after said main well and said subwell are formed; and forming a source of said first conductivity type in said channel well such that an edge of said source extends under said gate electrode and such that said source is shallower and narrower than said channel well, wherein the concentration of said source is higher than that of said layer over said semiconductor substrate.

11. The method according to claim 10, further comprising the step of forming a contact in each of said channel well and said subwell such that each said contact is shallower than a corresponding one of said channel well and said subwell.

12. A method of forming a semiconductor device according to claim 10, wherein a DMOS transistor portion is formed in a region of said main well and an NMOS logic portion is formed in a region of said subwell.

13. A method of forming a semiconductor device according to claim 10, wherein said main well is formed in a main well region, and said subwell is formed in a subwell region, and wherein said main well region and said subwell region are formed so that said first control element shows a reach-through phenomenon earlier than said subwell region, when both said main well region and said subwell region are biased with an identical voltage.

14. A method of forming a semiconductor device according to claim 10, wherein said method further comprises a step of forming a contact of said second conductivity type at a place adjacent to said another source and in the vicinity of a surface portion of said substrate, after said another source has been formed.

15. A method of forming a semiconductor device according to claim 10, wherein a tip portion of said internal columnar well reaches in a vicinity of a bottom portion of said channel well.

16. A method of forming a semiconductor device, comprising the steps of:

preparing a semiconductor substrate of a first conductivity type, forming a layer of said first conductivity type over said semiconductor substrate, said semiconductor substrate having a higher concentration than said layer, and implanting ions to form a main well of a second conductivity type in a vertical semiconductor device forming area on which a first control element having a first allowable current is formed, as well as a subwell in a semiconductor island forming area on which a second control element having a second allowable current is formed, said second allowable current being smaller than said first allowable current;

forming a gate electrode on a gate insulation film formed on said layer, in the vertical semiconductor device forming area except over said main well;

forming a channel well of said second conductivity type such that an edge of said channel well extends under said gate electrode and such that said channel well overlaps said main well and is shallower than said main well;

forming a source of said first conductivity type in said channel well such that an edge of said source extends under said gate electrode and such that said source is shallower and narrower than said channel well, wherein the concentration of said source is higher than that of said layer over said semiconductor substrate;

forming a contact of said second conductivity type in said channel well; and forming said contact in said subwell, such that said contact in said channel well is deeper than that in said subwell, said contact being formed after said main well and said subwell are formed.

17. The method according to claim 16, wherein said contact forming step increases any one of a doping quantity of ions and an ion acceleration voltage for a contact forming area in said main well to more than any one of a doping quantity of ions and an ion acceleration voltage for a contact forming area in said subwell, respectively.

18. A method of forming a semiconductor device according to claim 16, wherein a DMOS transistor portion is formed in a region of said main well and an NMOS logic portion is formed in a region of said subwell.

19. A method of forming a semiconductor device according to claim 16, wherein said main well is formed in a main well region, and said subwell is formed in a subwell region, and wherein said main well region and said subwell region are formed so that said first control element shows a reach-through phenomenon earlier than said subwell region, when both said main well region and said subwell region are biased with an identical voltage.

20. A method of forming a semiconductor device according to claim 16, wherein said contact forming step forms said contact in said channel well and said contact in said subwell in separate processes.

21. A method of forming a semiconductor device according to claim 16, wherein said contact forming step forms said contacts provided in said channel well and said subwell simultaneously by implanting ions thereinto and when said ions should be implanted into said subwell, a mask for reducing the amount of ions to be implanted into said subwell is provided over a top surface of said subwell so that said ions being implanted thereinto pass through said mask.

* * * * *